United States Patent
Abdo

(10) Patent No.: US 10,262,275 B1
(45) Date of Patent: Apr. 16, 2019

(54) SELECTIVE SWITCHING OF FREQUENCY MULTIPLEXED MICROWAVE SIGNALS USING CASCADING MULTI-PATH INTERFEROMETRIC JOSEPHSON SWITCHES WITH NONOVERLAPPING BANDWIDTHS

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/829,255

(22) Filed: Dec. 1, 2017

(51) Int. Cl.
*G06N 99/00* (2010.01)
*H04Q 11/00* (2006.01)

(52) U.S. Cl.
CPC ....... *G06N 99/002* (2013.01); *H04Q 11/0005* (2013.01); *H04Q 2011/0007* (2013.01); *H04Q 2213/13291* (2013.01)

(58) Field of Classification Search
CPC ............. G06N 99/002; H04Q 11/0005; H04Q 2011/0007; H04Q 2213/13291
USPC .......................................................... 398/48
See application file for complete search history.

(56) References Cited

U.S. PATENT DOCUMENTS

| 4,162,323 | A | | 7/1979 | Kahan | |
|---|---|---|---|---|---|
| 5,411,937 | A | * | 5/1995 | Wendt | ................... B82Y 10/00 216/3 |
| 5,552,735 | A | * | 9/1996 | Kang | ................... H03K 17/92 327/367 |

(Continued)

FOREIGN PATENT DOCUMENTS

| JP | 2009194646 A | 8/2009 |
|---|---|---|
| KR | 100604396 B1 | 7/2006 |

(Continued)

OTHER PUBLICATIONS

List of related IBM applications (Year: 2017).*

(Continued)

*Primary Examiner* — Dalzid E Singh
(74) *Attorney, Agent, or Firm* — Garg Law Firm, PLLC; Raakesh Garg; Grant Johnson

(57) ABSTRACT

A cascading selective microwave switch (cascade) includes a set of Josephson devices, each Josephson device in the set having a corresponding operating bandwidth of microwave frequencies, wherein different operating bandwidths have different corresponding center frequencies. A series coupling is formed between first Josephson device from the set and an $n^{th}$ Josephson device from the set. the series coupling causes the first Josephson device in an open state to reflect back to an input port of the first Josephson device a signal of a first frequency from a frequency multiplexed microwave signal (multiplexed signal) and the $n^{th}$ Josephson device in a closed state to transmit a signal of an $n^{th}$ frequency in the multiplexed signal from an input port of the $n^{th}$ Josephson device to an output port of the $n^{th}$ Josephson device.

20 Claims, 7 Drawing Sheets

(56) References Cited

U.S. PATENT DOCUMENTS

| | | | |
|---|---|---|---|
| 6,374,093 B1 | 4/2002 | Pesola | |
| 6,486,756 B2* | 11/2002 | Tarutani | H01L 27/18 257/E27.007 |
| 9,130,508 B1 | 9/2015 | Kang et al. | |
| 9,455,707 B2* | 9/2016 | Herr | H03K 3/38 |
| 9,735,776 B1 | 8/2017 | Abdo | |
| 9,787,278 B1 | 10/2017 | Abdo | |
| 2004/0012407 A1* | 1/2004 | Amin | B82Y 10/00 326/3 |
| 2013/0214979 A1 | 8/2013 | McMillin et al. | |
| 2015/0119252 A1* | 4/2015 | Ladizinsky | B82Y 10/00 505/170 |
| 2016/0308502 A1 | 10/2016 | Abdo | |
| 2016/0380636 A1 | 12/2016 | Abdo | |
| 2017/0093381 A1 | 3/2017 | Abdo | |

FOREIGN PATENT DOCUMENTS

| | | |
|---|---|---|
| WO | 03034542 A1 | 10/2002 |
| WO | 2015057839 A1 | 4/2015 |
| WO | 20150057839 A1 | 4/2015 |
| WO | 2016094045 A1 | 6/2016 |

OTHER PUBLICATIONS

Appendix P, 2017.

PCT, International Searching Authority, P201703600, PCT/E P2018/050247, dated Jun. 8, 2018.

PCT, International Searching Authority, PCT/IB 2017/057987, dated Aug. 22, 2018.

PCT, International Searching Authority, PCT/E P2018/050247, dated Aug. 6, 2018.

PCT, International Searching Authority, PCT/E P2018/050244, dated Aug. 24, 2018.

PCT, International Searching Authority, PCT/E P2018/050245, dated Sep. 7, 2018.

PCT, International Searching Authority, PCT/EP2018/050251, dated Aug. 29, 2018.

PCT, International Searching Authority, PCT/EP2018/050246, dated Aug. 17, 2018.

PCT, Written Opinion of the International Searching Authroity (Separate Sheet), PCT/EP2018/050253, ISA/237, EPO—dated Apr. 2005.

Selective Switching of Frequency Multiplexed Microwave Signals Using Cascading Multi-Path Interferometric Josephson Switches with Nonoverlapping Bandwidths.

Frattini Ne et al: '3-wave mixing Josephson dipole element', Applied Physics Letters, A I P Publishing LLC, US, vol. 110, No. 22, May 31, 2017 (May 31, 2017), XP012219271, ISSN: 0003-6951, DOI: 10.1063/1.4984142, retrieved on May 31, 2017.

Baleegh Abdo et al: "Multi-Path 1,4,12, Interferometric Josephson Directional 13, 16 Amplifier for Qubit Readout", arxiv.org, Cornell University Library, 281 Olin Library Cornell University Ithaca NY 14853, Oct. 8, 2817 (2817-18-88), XP888826758, A p. 2, paragraph 4—p. 5, paragraph 1-, 2,3, figures 1-3.

Baleegh Abdo et al: "Directional Amplification with a Josephson Circuit", Physical Review X, vol. 3, No. 3, Jul. 1, 2013 (Jul. 1, 2013), XP055493386, DOI: 10.1103/PhysRevX.3.031001 A p. 2, left-hand column, paragraph 4 p. 3, left-hand column, paragraph 2; figure 1, p. 3, right-hand column, paragraph 3 page 4, left-hand column, paragraph 1; figure 2.

Westig MP et al:"Josephson parametric reflection amplifier with integrated directionality", arxiv.org, Cornell University Library, 201 Olin Library Cornell University Ithaca, NY 14853, Jun. 28, 2017 (Jun. 28, 2017), XP080773209, p. 1, right-hand column, paragraph 2; figure 1.

Bergeal N et al: "Analog information processing at the Quantum limit with a Josephson ring modulator", arxiv.org, Cornell University Library, 201 Olin Library Cornell University Ithaca, NY 14853, May 22, 2008 (May 22, 2008), XP080419198, DOI: 10.1038/NPHYS1516, p. 5-p. 15.

Naaman et al: "On-chip Josephson 1-6, junction microwave switch", 11-17, Applied Physics Letters, A I P Publishing LLC, US, vol. 108, No. 11, Mar. 14, 2016 (Mar. 14, 2016), pp. 112601-1, XP012205944, ISSN: 0003-6951, 001: 10.1063/1.4943602.

* cited by examiner

SELECTIVE SWITCHING OF FREQUENCY MULTIPLEXED MICROWAVE SIGNALS USING CASCADING MULTI-PATH INTERFEROMETRIC JOSEPHSON SWITCHES WITH NONOVERLAPPING BANDWIDTHS

TECHNICAL FIELD

The present invention relates generally to a device, a fabrication method, and fabrication system for a frequency multiplexed microwave light switch usable with superconducting qubits in quantum computing. More particularly, the present invention relates to a device, method, and system for selective switching of frequency-multiplexed microwave signals using cascading multi-path interferometric Josephson switches in nonoverlapping bandwidths, where the switches are based on nondegenerate three-wave-mixing Josephson devices.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states-such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These is and Os act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature —pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states —|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the |0> and |1> states of the qubit. This operational constraint on any circuit that operates with quantum information necessitates special considerations in fabricating semiconductor and superconducting structures that are used in such circuits.

A microwave switch is a device that allows microwave light waves to pass through it in a substantially loss-less manner (transmission) when the switch is in a closed state, and reflects the microwave light waves back to the sender when in an open state (reflection). A reference herein to an "switch" is a reference to a microwave switch. In other words, the switch operates as a binary microwave light bridge, and the response of the device is dependent on the state of the device, regardless of the direction from which the light signal might be attempting to go across the switch (from port 1 to 2 or from port 2 to 1). Switches are used in quantum computing for allowing or disallowing microwave signals into and out of the quantum processor as needed.

A multi-path interferometric Josephson switch based on nondegenerate three-wave-mixing Josephson devices is hereinafter compactly and interchangeably referred to as Multi-Path Interferometric Josephson SWitch (MPIJSW). An MPIJSW device can be implemented as a microwave switch in a superconducting quantum circuit. The MPIJSW is a direction agnostic device whose operation is controlled by a phase of a microwave drive coupled to the switch.

A superconducting nondegenerate three-wave-mixing device can be used as part of the MPIJSW by operating the mixing device in a frequency conversion (no photon gain) mode. The nondegenerate three-wave mixer can be a Josephson parametric converter (JPC).

A superconducting nondegenerate three-wave mixer has 3 ports, which are Signal port (S) through which a microwave signal of frequency $f_S$ can be input, Idler port (I) through which an idler microwave signal of frequency $f_I$ can be input, and pump port (P) through which microwave signal of frequency $f_P$ and phase $\varphi_p$ can be input. In one configuration (without loss of generality), $f_I$ is a high frequency, $f_P$ is a low frequency, and $f_S$ is a medium frequency, when $f_P$, $f_S$, and $f_I$ are compared relative to each other (i.e., $f_I > f_S > f_P$). The superconducting nondegenerate three-wave mixer is characterized as nondegenerate because it has two modes—namely S and I, which are both spatially and spectrally different.

From Idler to Signal port, the Idler microwave signal enters the Idler port at frequency $f_2$, is down converted, and exits the Signal port at frequency $f_1$. From Signal to Idler port, the microwave signal enters the Signal port at frequency $f_1$, is up converted, and exits the Idler port at frequency $f_2$. The pump microwave signal provides the energy for frequency up conversion and frequency down conversion. The pump frequency is $f_P$, where $f_P = f_1 - f_S = f_2 - f_1$.

On resonance, the nondegenerate three-wave mixer (e.g., JPC) satisfies the following scattering matrix when operated in noiseless frequency conversion:

$$[S] = \begin{pmatrix} r & t \\ t' & r \end{pmatrix} = \begin{pmatrix} \cos\theta & ie^{-i\varphi_P}\sin\theta \\ ie^{i\varphi_P}\sin\theta & \cos\theta \end{pmatrix}$$

where $\tan h(i\theta/2) = i|\rho|$ and $\rho$ is a dimensionless pump amplitude (varies between 0 and 1).

As a modification to the nondegenerate three-wave mixer and as further recognized herein, the phase of the pump $\varphi_p$ (which can be denoted as $\varphi_1$ and $\varphi_2$ for two pump signals) will be utilized in accordance embodiments described herein. Since the scattering matrix is unitary, the following relation holds $|r|^2 + |t|^2 = 1$, where r is the reflection coefficient, t is the transmission parameter, and $t' = -t^*$ (where $t^*$ is the conjugate of t). Unitary means that the nondegenerate three wave mixer preserves the energy and the coherence of the phase. The frequency conversion working point of the superconducting nondegenerate three-wave-mixing device is $|r|^2 = 0, |t|^2 = 1$. At the frequency conversion working point, there is no reflection and there is full transmission with frequency conversion.

Two suitable manifestations of the nondegenerate three-wave mixer, each operating at the same frequency conversion working point are used as one component in an MPIJSW according to the illustrative embodiments. JPC is one such non-limiting manifestation.

In quantum circuits, microwave signals can include more than one frequency. Generally, the microwave signals span a band of frequencies. An MPIJSW generally operates with a comparatively narrow band of frequencies around a central frequency for which the MPIJSW is tuned. The illustrative embodiments recognize that a new switch design is needed that is capable of switching signals of all or some microwave signals having different, even if a frequency of a signal lies outside the operational frequency band of a single MPIJSW.

SUMMARY

The illustrative embodiments provide a superconducting device, and a method and system of fabrication therefor. A superconducting device of an embodiment forms a cascading selective microwave switch (cascade), which includes a set of Josephson devices, each Josephson device in the set having a corresponding operating bandwidth of microwave frequencies, wherein different operating bandwidths have different corresponding center frequencies; and a series coupling between first Josephson device from the set and an nth Josephson device from the set, wherein the series coupling causes the first Josephson device in an open state to reflect back to an input port of the first Josephson device a signal of a first frequency from a frequency multiplexed microwave signal (multiplexed signal) and the nth Josephson device in a closed state to transmit a signal of an nth frequency in the multiplexed signal from an input port of the nth Josephson device to an output port of the nth Josephson device.

In another embodiment, the cascade further includes an (n-1)th Josephson device from the set in the series coupling, wherein n is greater than 1, wherein the (n-1)th Josephson device is included in the series coupling between the first Josephson device and the nth Josephson device, and wherein the (n-1)th Josephson device in the open state reflects back to an input port of the (n-1)th Josephson device a signal of an (n-1)th frequency from the multiplexed signal.

In another embodiment, the cascade further includes an (n-1)th Josephson device from the set in the series coupling, wherein n is greater than 1, wherein the (n-1)th Josephson device is included in the series coupling between the first Josephson device and the nth Josephson device, and wherein the (n-1)th Josephson device in the closed state transmits a signal of an (n-1)th frequency in the multiplexed signal from an input port of the (n-1)th Josephson device to an output port of the (n-1)th Josephson device.

In another embodiment, the series coupling causes the first Josephson device in the open state to transmit the signal of the nth frequency from the multiplexed signal through the series coupling and the nth Josephson device in the open state to transmit the first frequency through the series.

In another embodiment, the series coupling causes the first Josephson device when open to transmit, from the multiplexed signal, signals of all frequencies that are incoming into the first Josephson except the signal of the first frequency through the series coupling, and wherein the series coupling causes the nth Josephson device when open to transmit, from the multiplexed signal, signals of all frequencies that are incoming into the nth Josephson except the signal of the nth frequency through the series coupling.

In another embodiment, a first operating bandwidth of microwave frequencies corresponding to the first Josephson device is nonoverlapping for at least some frequencies with an nth operating bandwidth of microwave frequencies corresponding to the nth Josephson device.

In another embodiment, a total switching bandwidth of the cascade comprises the first operating bandwidth and the nth operating bandwidth.

In another embodiment, the first Josephson device in the set of Josephson devices is an MPIJSW, which includes a first nondegenerate microwave mixer device (first mixer); a second nondegenerate microwave mixer device (second mixer); a first input/output (I/O) port coupled to an input port of the first mixer and an input port of the second mixer; and a second I/O port coupled to the input port of the first mixer and the input port of the second mixer, wherein the signal of a first frequency communicated between the first I/O port and the second I/O port is transmitted while propagating in either direction between the first I/O port to the second I/O port through the first mixer when the MPIJSW is closed, and wherein the first frequency is in a first operating bandwidth of the first Josephson device.

In another embodiment, the cascade further includes a first microwave pump injecting a first microwave drive into the first mixer at a pump frequency and a first pump phase, wherein the first microwave pump is configured to cause the first mixer to operate at a frequency conversion working point; and a second microwave pump injecting a second microwave drive into the second mixer at the pump frequency and a second pump phase wherein the second microwave pump is configured to cause the second mixer to operate at the frequency conversion working point.

In another embodiment, the first mixer and the second mixer are each a nondegenerate three-wave mixer.

In another embodiment, the first mixer and the second mixer are each a Josephson parametric converter (JPC), and wherein the first mixer and the second mixer are nominally identical.

An embodiment includes a fabrication method for fabricating the superconducting device.

An embodiment includes a fabrication system for fabricating the superconducting device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
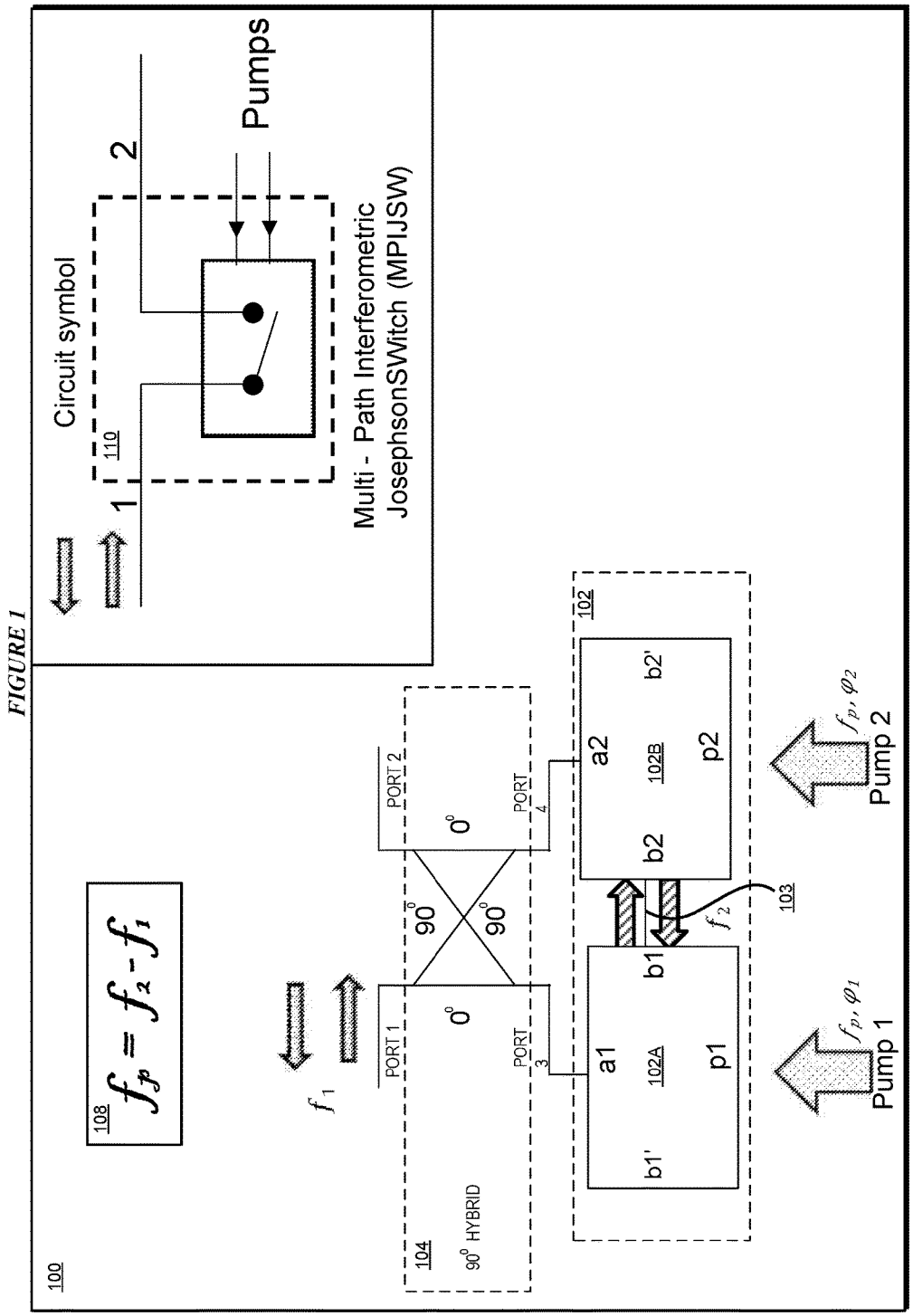
FIG. 1 depicts a block diagram of an example configuration of an MPIJSW that is usable in a cascade in accordance with an illustrative embodiment.

The illustrative embodiments used to describe the invention generally address and solve the above-described needs for switching signals of some or all frequency-multiplexed microwave signals. The illustrative embodiments provide a switch device comprising cascading multi-path interferometric Josephson switches having nonoverlapping bandwidths, where the switches are based on nondegenerate three-wave-mixing Josephson devices. Such a cascading switch device is compactly referred to herein as a cascading MPIJSW.

An operation described herein as occurring with respect to a frequency of frequencies should be interpreted as occurring with respect to a signal of that frequency or frequencies. All references to a "signal" are references to a microwave signal unless expressly distinguished where used.

The term "frequency multiplexed signal" refers to a composite signal which includes multiple signals at various frequencies and is therefore not different from the term "frequency multiplexed signals", which refers to signals at various frequencies multiplexed together. The two terms are therefore used interchangeably to mean more than one signals of different frequencies multiplexed or presented together to a device or in an operation.

An embodiment provides a configuration of a cascading MPIJSW. Another embodiment provides a fabrication method for the cascading MPIJSW, such that the method can be implemented as a software application. The application implementing a fabrication method embodiment can be configured to operate in conjunction with an existing superconductor fabrication system—such as a lithography system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example mixers, hybrids, and other circuit components are used in the figures and the illustrative embodiments. In an actual fabrication or circuit, additional structures or component that are not shown or described herein, or structures or components different from those shown but for the purpose described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function within a cascading MPIJSW, and such adaptations are contemplated within the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a block diagram of an example configuration of an MPIJSW that is usable in a cascade in accordance with an illustrative embodiment. MPIJSW configuration 100 comprises pair 102 of nondegenerate three-wave mixer 102A and nondegenerate three-wave mixer 102B. Each of nondegenerate three-wave mixer 102A and nondegenerate three-wave mixer 102B is operating at the beam splitter working point (which is one example of a frequency conversion working point).

Nondegenerate three-wave mixer 102A is configured with physical ports a1 (corresponding to signal port S), b1 (corresponding to signal port I), p1 (corresponding to signal port P), and b1' (corresponding to signal port I). The pump frequency ($f_P$) is a difference between idler frequency ($f_2$) and input signal frequency ($f_1$) according to expression 108.

Nondegenerate three-wave mixer 102B is configured with physical ports a2, b2, p2, and b2', and pump frequency ($f_P$) in a similar manner. Port b1 of mixer 102A and port b2 of mixer 102B are coupled together using transmission line 103.

Ports 1 and 2 of 90-degree hybrid 104 form ports 1 and 2, respectively, of MPIJSW 100, as described herein. Port a1 of nondegenerate three-wave mixer 102A is coupled with port 3 of hybrid 104. Port a2 of Nondegenerate three-wave mixer 102B is coupled with port 4 of hybrid 104.

Figure 2:
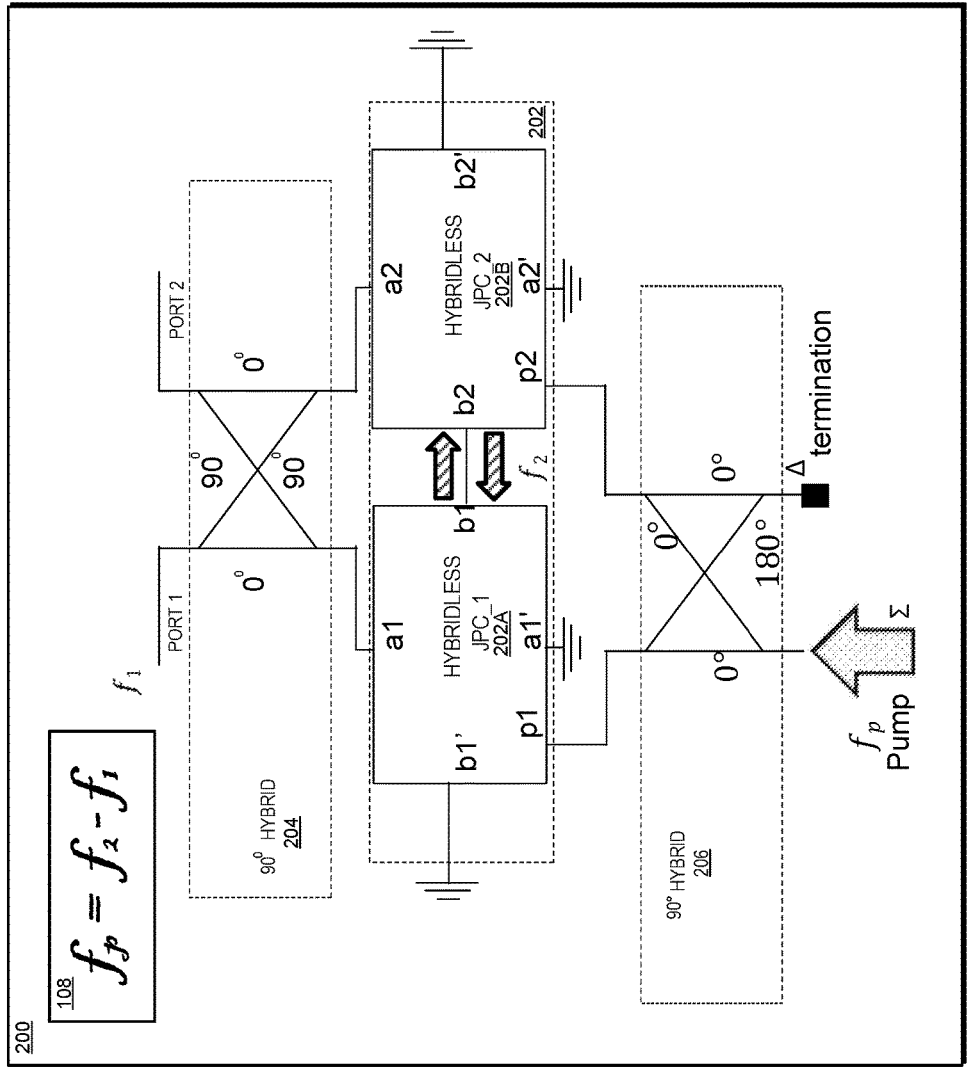
FIG. 2 depicts another alternate configuration for an MPIJSW that is usable in a cascade in accordance with an illustrative embodiment.

This configuration 100 of nondegenerate three-wave mixers 102A and 102B, and other possible similarly-purposed configurations using the described components, is compactly represented as symbol 110. For example, FIG. 2 depicts another possible similarly-purposed configuration using the described components. The state of the bar across the contacts inside the block of symbol 110 represents a transmitting (closed) or reflecting (open) state of the switch for signal from port 1 to port 2 or port 2 to port 1 in symbol 110 (symbol 110 as depicted in this figure shows an open switch). In other words, MPIJSW 110 transmits the signal from port 2 to port 1 (or port 1 to port 2) when closed but reflects an incoming signal from port 1 back out of port 1 (or reflects an incoming signal from port 2 back out of port 2) when open.

This series connection of the MPIJSW devices is not intuitive. In a normal series coupling of electrical or electronic elements, a parameter of the series is limited (e.g., the bandwidth of the series) by the weakest/smallest/lowest value of the parameter in the serial chain. The entire series of the elements operates at that weakest/smallest/lowest value. In contrast, the cascade of MPIJSW devices, due to the special properties of the MPIJSW devices used therein, out-of-band signals (a signal frequency that is not in the device's bandwidth) are not acted upon and allowed to simply pass through, and each device acts (switches) only upon that part of the signal that lies in its own bandwidth, thus providing a non-intuitive additive span in the bandwidth.

With reference to FIG. 2, this figure depicts another alternate configuration for an MPIJSW that is usable in a cascade in accordance with an illustrative embodiment. Hybrid 204 is a 90-degree hybrid and is configured with hybrid-less JPC 202A and hybrid-less JPC 202B in a manner substantially as hybrid 104 is configured with nondegenerate three-wave mixers 102A and 102B in FIG. 1. Configuration 200 uses a single pump drive in conjunction with hybrid 206 to provide the pump input to hybrid-less JPC 202A and hybrid-less JPC 202B. Configuration 200 is also represented by symbol 110.

Figure 3:
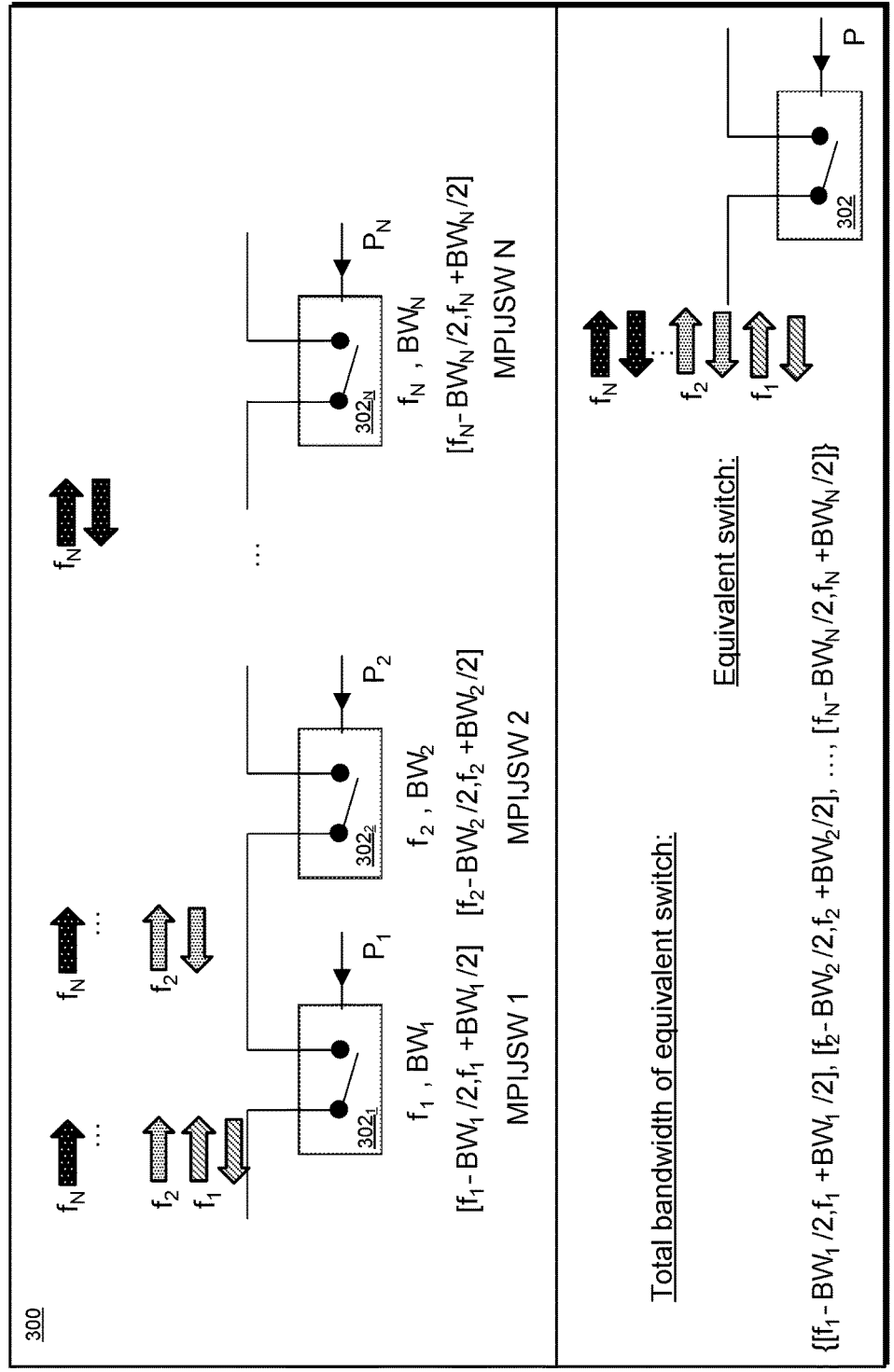
FIG. 3 depicts a block diagram of an example configuration and a total reflection operation of a cascading MPIJSW in accordance with an illustrative embodiment.
Figure 4:
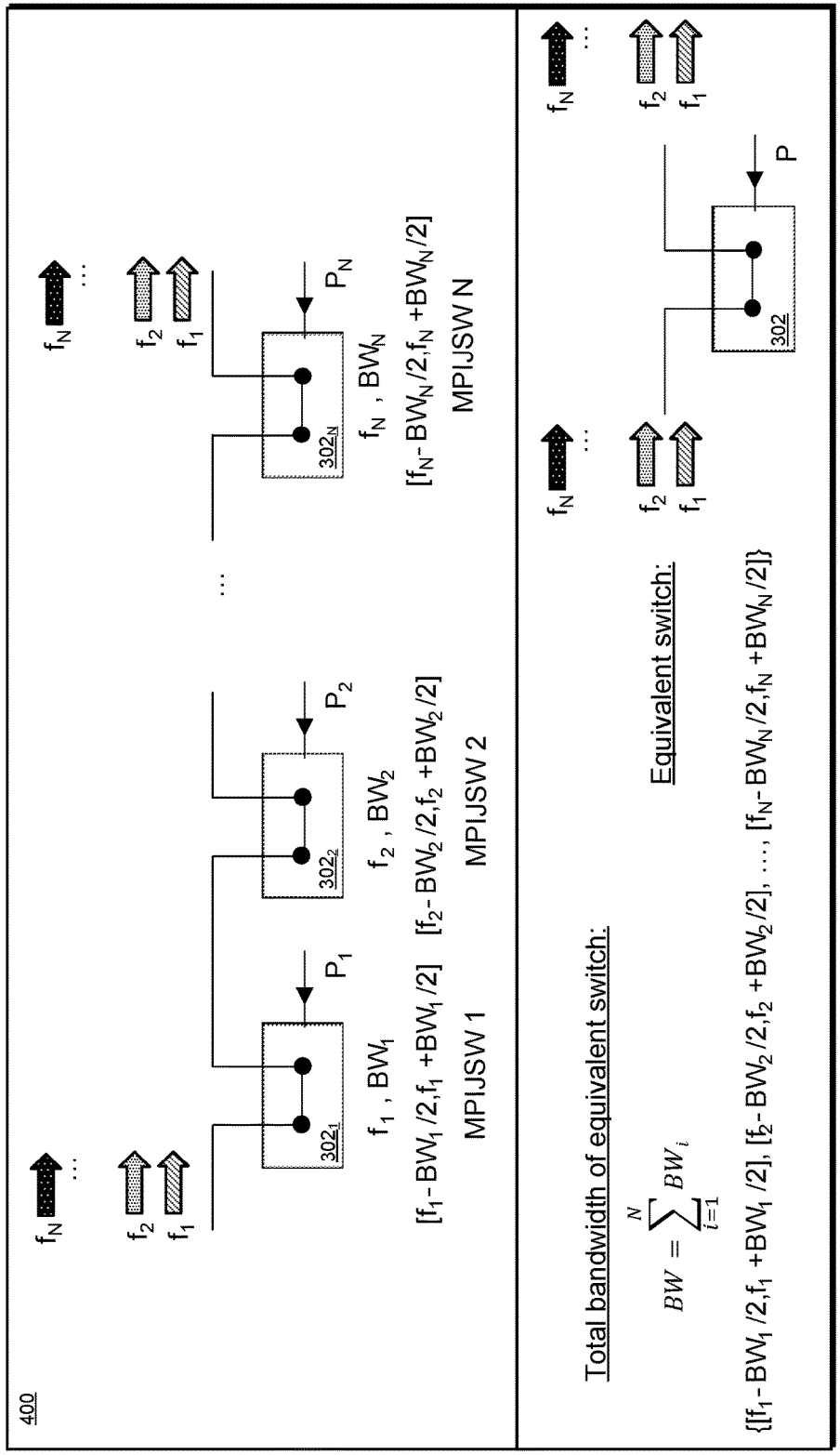
FIG. 4 depicts a block diagram of an example transmission operation of a cascading MPIJSW in accordance with an illustrative embodiment.
Figure 5:
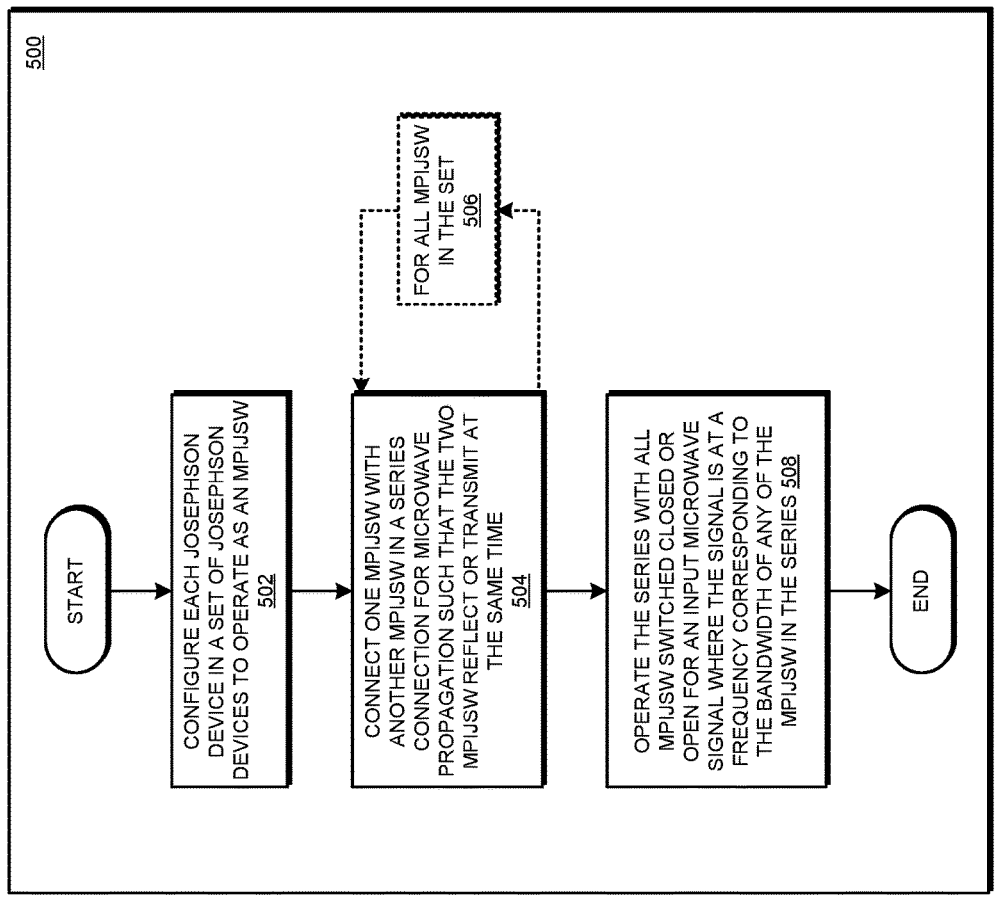
FIG. 5 depicts a flowchart of an example process for reflecting or transmitting signals of all frequencies in a frequency multiplexed microwave signal using cascading multi-path interferometric Josephson switches with nonoverlapping bandwidths in accordance with an illustrative embodiment.
Figure 6:
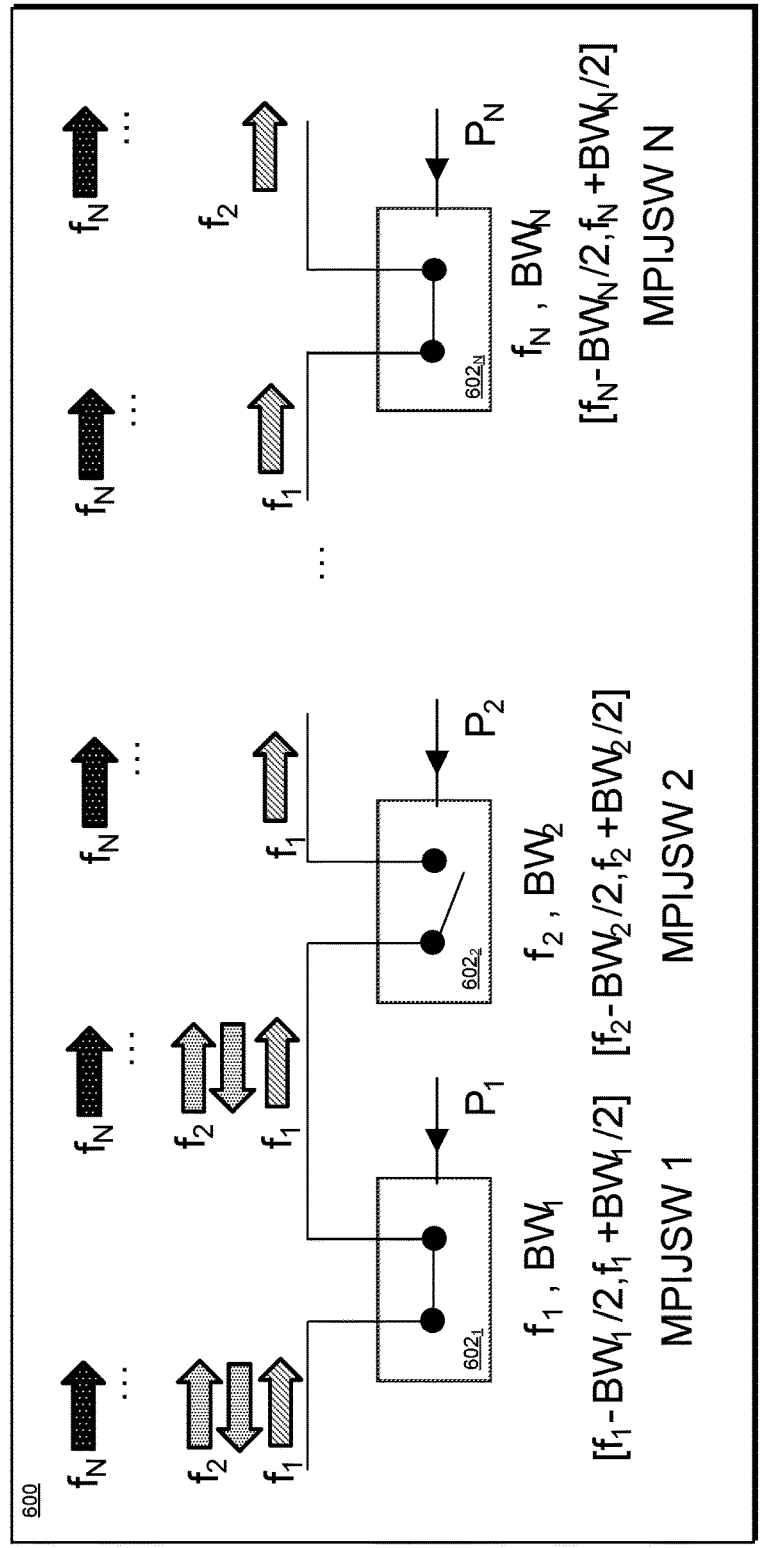
FIG. 6 depicts a block diagram of an example configuration and a selective switching operation of a cascading MPIJSW in accordance with an illustrative embodiment.
Figure 7:
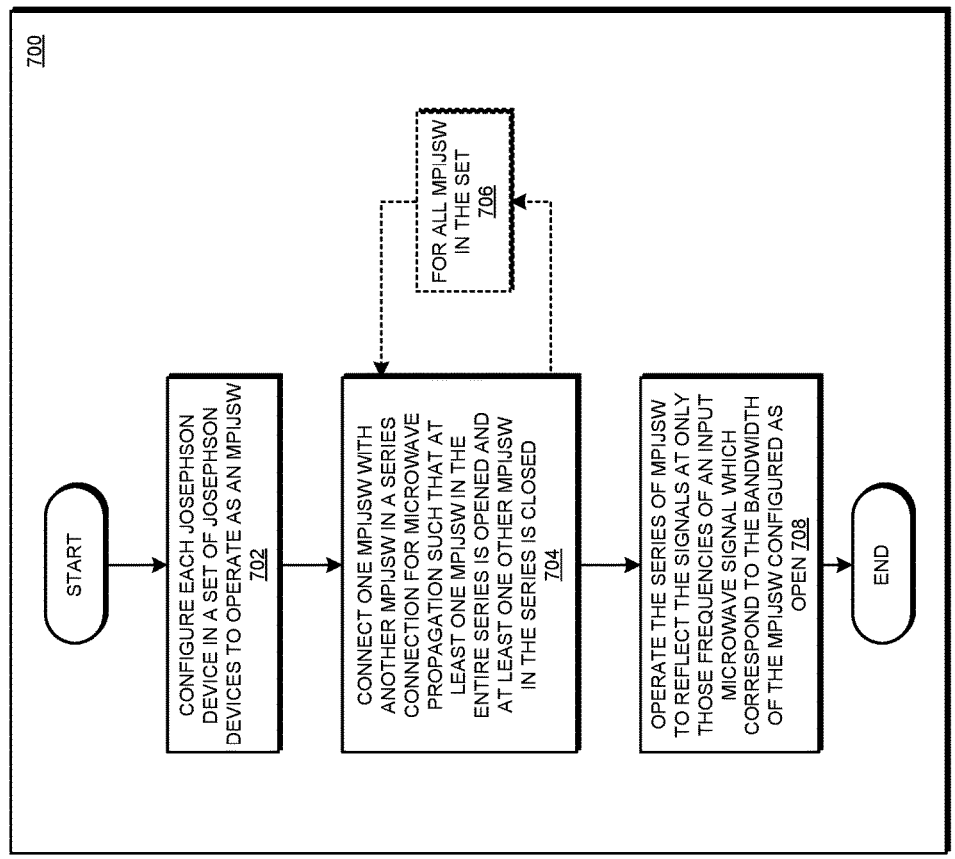
FIG. 7 depicts a flowchart of an example process for propagation or switching the signals of some but not all frequencies in a frequency multiplexed microwave signal using cascading multi-path interferometric Josephson switches with nonoverlapping bandwidths in accordance with an illustrative embodiment.

FIGS. 3-5 describe a cascading configuration and a manner of operating the same, to transmit or reflect signals of all frequency-multiplexed microwave signals having different frequencies. FIGS. 6-7 describe a different cascading configuration and a manner of operating the same, to selectively transmit or reflect signals of some but not all frequency-multiplexed microwave signals.

With reference to FIG. 3, this figure depicts a block diagram of an example configuration and a total reflection operation of a cascading MPIJSW in accordance with an illustrative embodiment. This cascading configuration reflects signals of all frequency-multiplexed microwave signals having different frequencies that are within the bandwidth of any of the cascaded MPIJSW devices. Each of MPIJSW devices $302_1$, $302_2$ ... $302_N$ is an MPIJSW according to symbol 110. MPIJSW devices $302_1$-$302_N$ represent N MPIJSW devices (N>1) that are cascaded in configuration 300.

A cascading of MPIJSW devices is a series connection of MPIJSW devices whereby one port (port 1 or 2) of the first MPIJSW ($302_1$) is coupled to an external circuit for receiving a microwave signal input; the other port (port 2 or 1, correspondingly) of the first MPIJSW ($302_1$) is coupled to one port of the next MPIJSW ($302_2$); the other port of the next MPIJSW ($302_2$) is coupled to one port of the next MPIJSW, and so on, until a port of N-1$^{th}$ MPIJSW is coupled to a port of the last MPIJSW ($302_N$), and the other port of the last MPIJSW ($302_N$) is coupled to an external circuit to which cascade 300 provides a microwave signal output.

Each MPIJSW $302_1$-$302_N$ is configured in cascade 300 such that each MPIJSW $302_1$-$302_N$ when open reflects back an input signal received at one of its ports back to the same port (all switches are open).

Furthermore, each MPIJSW $302_1$-$302_N$ in cascade 300 operates in a substantially nonoverlapping frequency band. For example, MPIJSW $302_1$ operates in a narrow bandwidth ($BW_1$) where a center frequency is $f_1$, i.e., half of $BW_1$ is below $f_1$ and including $f_1$ and half of $BW_1$ is above $f_1$. Therefore, $BW_1$ is $[f_1-BW_1/2$ to $f_1+BW_1/2]$. Similarly, MPIJSW $302_2$ has a center frequency $f_2$, and $BW_2$ of $[f_2-BW_2/2$ to $f_2+BW_2/2]$. And the MPIJSW devices in the set are defined in a similar manner until MPIJSW $302_N$ has a center frequency $f_N$, and $BW_N$ of $[f_N-BW_N/2$ to $f_N+BW_N/2]$. $BW_1$ ... $BW_N$ do not overlap, or overlap by an insignificant amount.

An MPIJSW in cascading configuration 300 operates only on signals in the bandwidth of frequencies for which it is tuned. In other words, an MPIJSW will reflect the signals of only those frequencies that fall within its operating bandwidth. The MPIJSW will pass in both directions and regardless of its open or closed state, in a substantially loss-less manner, the signals of frequencies outside of the operating bandwidth of that MPIJSW.

For example, MPIJSW $302_1$ will only reflect a signal of a frequency (substantially prevent the signal of the frequency from passing through MPIJSW $302_1$) in $BW_1$ if MPIJSW $302_1$ is open, but will allow signals of frequencies in $BW_2$, $BW_3$, $BW_4$ ... $BW_N$ to transmit through it to MPIJSW $302_2$ in a substantially loss-less manner regardless of the state of MPIJSW $302_1$ being open or closed. MPIJSW $302_1$ will allow signals of frequencies in $BW_1$ to transmit through it to MPIJSW $302_2$ only when MPIJSW $302_1$ is closed. Each MPIJSW $302_1$ ... $302_N$ in configuration 300 operates relative to its respective operating bandwidth and frequencies outside its operating bandwidth in a similar manner.

In configuration 300, MPIJSW $302_1$ reflects the signal of frequency $f_1$ because MPIJSW $302_1$ reflects the signals of frequencies in $BW_1$ when open, and MPIJSW $302_1$ is open and $f_1$ is in $BW_1$. MPIJSW $302_1$ allows signals of frequencies $f_2$ ... $f_N$ to pass regardless of being open because those frequencies are outside $BW_1$. Similarly, MPIJSW $302_2$ reflects the signal of frequency $f_2$ because MPIJSW $302_2$ reflects the signals of frequencies in $BW_2$ when open, and MPIJSW $302_2$ is open and $f_2$ is in $BW_2$. The signal of frequency $f_1$ never reached MPIJSW $302_2$ due to the reflection from MPIJSW $302_1$. MPIJSW $302_2$ allows signals of frequencies $f_3, f_i$ ... $f_N$ to pass because those frequencies are outside $BW_2$. MPIJSW $302_N$ reflects the signal of frequency $f_N$ because MPIJSW $302_N$ reflects the signals of frequencies in $BW_N$ when open, and MPIJSW $302_N$ is open and $f_N$ is in $BW_N$. The signals of frequencies $f_1$ ... $f_{N-1}$ never reached MPIJSW $302_N$ due to the reflection from MPIJSW $302_1$ ... $302_{N-1}$. Thus, as depicted in this figure, an input signal that multiplexes frequencies $f_1, f_2$ ... $f_N$ is completely reflected by cascade 300.

Configuration 300 is represented compactly as cascading MPIJSW 302. The effective bandwidth over which cascading MPIJSW 302 can reflect is therefore, $$BW=\{[f_1-BW_1/2 \text{ to } f_1+BW_1/2], [f_2-BW_2/2 \text{ to } f_2+BW_2/2], \ldots [f_N-BW_N/2 \text{ to } f_N+BW_N/2]\}$$

The reflection bandwidth BW of cascading MPIJSW 302 is greater than the reflection bandwidth of any single MPIJSW in configuration 300. Thus, cascading MPIJSW 302 is operable over a broader bandwidth than the operating bandwidth of a single MPIJSW.

With reference to FIG. 4, this figure depicts a block diagram of an example transmission operation of a cascading MPIJSW in accordance with an illustrative embodiment. Cascade 300, MPIJSW devices $302_1$, $302_2$ ... $302_N$, and cascading MPIJSW 302 are the same as in FIG. 3. Frequency $f_1$ is in $BW_1$ of MPIJSW $302_1$, $f_2$ is in $BW_2$ of MPIJSW $302_2$ ... $f_N$ is in $BW_N$ of MPIJSW $302_N$.

In the transmission operation of this figure, all switches are closed. Signals of frequencies $f_1, f_2$ ... $f_N$ are input at an input port of cascade 300, e.g., at port 1 (or port 2) of the first MPIJSW ($302_1$) in cascade 300. In cascade 300, MPIJSW $302_1$ transmits the signal of frequency $f_1$ to the next switch (MPIJSW $302_2$) because MPIJSW $302_1$ transmits the signals of frequencies in $BW_1$ and $f_1$ is in $BW_1$. MPIJSW $302_1$ also transmits signals of frequencies $f_2$ ... $f_N$ to the next switch because they are out of bandwidth $BW_1$. Operating in this manner, MPIJSW $302_1$ has effectively transmitted signals of all frequencies from the multiplexed input microwave signal. Similarly, each of 2 through $N^{th}$ MPIJSW transmits signals of frequency $f_1$ ... $f_N$ by similar reasoning pertaining to their respective bandwidths $BW_2$ ... $BW_N$.

Operating in this manner, each MPIJSW when closed transmits a signal of that frequency which is within the bandwidth of that MPIJSW and transmits signals of those frequencies which are outside the bandwidth of that MPI-JSW. Thus, cascade 300 effectively performs complete transmission of the frequency multiplexed microwave signal input.

Cascading MPIJSW 302 according to configuration 300 has the effective bandwidth over which cascading MPIJSW 302 can transmit as, $$BW=\{[f_1-BW_1/2 \text{ to } f_1+BW_1/2], [f_2-BW_2/2 \text{ to } f_2+BW_2/2], \ldots [f_N-BW_N/2 \text{ to } f_N+BW_N/2]\}$$

Again, the transmission bandwidth BW of cascading MPIJSW 302 is greater than the bandwidth of any single MPIJSW in configuration 300. Thus, cascading MPIJSW 302 is operable to transmit a frequency multiplexed signal that spans a broader bandwidth than the operating bandwidth of a single MPIJSW.

With reference to FIG. 5, this figure depicts a flowchart of an example process for reflecting or transmitting signals of all frequencies in a frequency multiplexed microwave signal using cascading multi-path interferometric Josephson switches with nonoverlapping bandwidths in accordance with an illustrative embodiment. Process 500 can be implemented using cascading MPIJSW 302 for the operations described in FIGS. 3 and 4.

Each Josephson device in a set of Josephson devices is configured as an MPIJSW (block 502). The MPIJSW devices are connected in a cascade by connecting one MPIJSW with another MPIJSW in a series connection (block 504). The MPIJSW devices in the series connection are configured such that all MPIJSW devices in the series reflect or transmit a microwave signal of their respective frequency at the same time in the cascade. The cascade is built by adding all MPIJSW devices from the set in series in this manner (block 506).

The cascade operates to reflect (as in FIG. 3) or transmit (as in FIG. 4) an input microwave signal containing a signal at a frequency corresponding to the bandwidth of any of the MPIJSW devices in the series (block 508).

FIGS. 6-7 now describe a different cascading configuration and a manner of operating the same, to selectively reflect (and therefore also selectively transmit) signals of some but not all frequencies of a frequency multiplexed microwave signal.

With reference to FIG. 6, this figure depicts a block diagram of an example configuration and a selective switching operation of a cascading MPIJSW in accordance with an illustrative embodiment. This cascading configuration reflects signals of only some frequencies in a frequency multiplexed microwave signal. Each of MPIJSW devices $602_1, 602_2$ ... $602_N$ is an MPIJSW according to symbol 110. MPIJSW devices $602_1$-$602_N$ represent N MPIJSW devices (N>1) that are cascaded in configuration 600.

A cascading of MPIJSW devices is a series connection of MPIJSW devices whereby an MPIJSW in the series can be connected such that one or more MPIJSW devices are open and one or more MPIJSW devices are closed at the same time. For example, non-limiting example cascade 600 is formed by coupling a port of the first MPIJSW ($602_1$, which is closed in example configuration 600) to an external circuit for receiving a frequency multiplexed microwave signal input. The other port of the first MPIJSW ($602_1$) is coupled to a port of the next MPIJSW ($602_2$, which is open in example configuration 600). The other port of MPIJSW $602_2$ is coupled to a port of the next MPIJSW, and so on, until a port of N-1$^{th}$ MPIJSW is coupled to a port of the last MPIJSW ($602_N$, which is closed in example configuration 600). The other port of the last MPIJSW ($602_N$) is coupled to an external circuit to which cascade 600 provides a microwave signal output.

Without implying any limitation, and only for the clarity of the description, example configuration 600 is depicted with only one MPIJSW ($602_2$) open. Any number of MPIJSW devices can be coupled in series and opened, and any number of MPIJSW devices can be coupled in series and closed, to construct a cascade that selectively reflects signals of certain frequencies. The cascade constructed in this manner reflects back signals of those frequencies which correspond to the MPIJSW devices that are open, and transmits signals of those frequencies which correspond to those MPIJSW devices that are closed.

Thus, depending upon which group of signal frequencies from a frequency multiplexed microwave signal have to be transmitted, one or more MPIJSW $602_1$-$602_N$ having bands corresponding to those frequencies are configured in cascade 600 as closed. And depending upon which signal frequencies from a frequency multiplexed microwave signal have to be reflected, one or more MPIJSW $602_1$-$602_N$ having bands corresponding to those frequencies are configured in cascade 600 as open.

Furthermore, each MPIJSW $602_1$-$602_N$ in cascade 600 operates in a substantially nonoverlapping frequency band. For example, MPIJSW $602_1$ operates in a relatively narrow bandwidth ($BW_1$) where a center frequency is $f_1$, i.e., half of $BW_1$ is below $f_1$ and includes $f_1$ and half of $BW_1$ is above $f_1$. Therefore, $BW_1$ is $[f_1-BW_1/2$ to $f_1+BW_1/2]$. Similarly, MPIJSW $602_2$ has a center frequency $f_2$, and $BW_2$ of $[f_2-BW_2/2$ to $f_2+BW_2/2]$. And the MPIJSW devices in the set are defined in a similar manner until the $(N-1)^{th}$ MPIJSW has a center frequency $f_{N-1}$, and $BW_{N-1}$ of $[f_{N-1}-BW_{N-1}/2$ to $f_{N-1}+BW_{N-1}/2]$; and MPIJSW $602_N$ has a center frequency $f_N$, and $BW_N$ of $[f_N-BW_N/2$ to $f_N+BW_N/2]$. $BW_1 \ldots BW_N$ do not overlap, or overlap only by an insignificant amount.

An MPIJSW in cascading configuration 600 reflects only the signals of that bandwidth of frequencies for which it is tuned. In other words, an MPIJSW when open will reflect (flowing in any direction from port 2-1 or port 1-2 of that MPIJSW) signals of those frequencies that fall within its operating bandwidth. The MPIJSW will pass in both directions, in a substantially loss-less manner, signals of frequencies outside the operating bandwidth of that MPIJSW regardless of that MPIJSW being open or closed.

For example, MPIJSW $602_2$ will only reflect a signal of a frequency in $BW_2$ if MPIJSW $602_2$ is open, but will allow signals of frequencies in $BW_1$, $BW_3$, $BW_4 \ldots BW_{N-1}$, $BW_N$ to pass in a substantially loss-less manner regardless of the state of MPIJSW $602_2$. When closed, MPIJSW $602_2$ will transmit signals of frequencies not only in $BW_2$ but also in $BW_1$, $BW_3$, $BW_4 \ldots BW_{N-1}$, $BW_N$ in a substantially loss-less manner in any direction (port 1-2 or port 2-1). Each MPIJSW $602d \ldots 602_N$ in configuration 600 operates relative to its respective operating bandwidth and frequencies outside its operating bandwidth in a similar manner.

In configuration 600, MPIJSW $602_1$ transmits a signal of frequency $f_1$ to the next MPIJSW (MPIJSW $602_2$) because MPIJSW $602_1$ transmits the signals of frequencies in $BW_1$ when closed, MPIJSW $602_1$ is closed, and $f_1$ is in $BW_1$. MPIJSW $602_1$ transmits signals of frequencies $f_2 \ldots f_N$ because those frequencies are outside $BW_1$. However, MPIJSW $602_2$ is configured in cascade 600 in an open state, and therefore reflects the signal of frequency $f_2$ because MPIJSW $602_2$ reflects the signals of frequencies in $BW_2$ when open, MPIJSW $602_2$ is open, and $f_2$ is in $BW_2$. MPIJSW $602_2$ transmits signals of frequencies $f_1, f_i \ldots f_{N-1}, f_N$ because those frequencies are outside $BW_2$. In the reflection path, $f_2$ being out-of-band $BW_1$, MPIJSW $602_1$ allows signal at $f_2$ to be transmitted in the reverse direction so that the signal at $f_2$ is reflected back to the sender on cascade 600's input port. Assuming that all other MPIJSW devices in cascade 600 are configured as closed, the multiplexed signal with signals at $f_1, f_3 \ldots f_i \ldots f_{N-1}, f_N$ (no $f_2$) reaches MPIJSW $602_N$. MPIJSW $602_N$ transmits the signal of frequency $f_N$ because MPIJSW $602_N$ transmits the signals of frequencies in $BW_N$ when closed, MPIJSW $602_N$ is closed, and $f_N$ is in $BW_N$. MPIJSW $602_N$ transmits signals of frequencies $f_1, f_3 \ldots f_i \ldots f_{N-1}$ because those frequencies are outside $BW_N$. Thus, as depicted in this figure, an input signal that multiplexes frequencies $f_1, f_2 \ldots f_N$ is transmitted by cascade 600 in a substantially loss-less manner (zero or negligible attenuation) in selected frequencies $f_1, f_3 \ldots f_i \ldots f_N$ with the signal of frequency $f_2$ having been selectively reflected back from the input signal.

To generalize, if input signal (at one port of the cascade) has signals of frequencies $f_A$, $f_B$, $f_C$, $f_D$, $f_E$, $f_F$, $f_G$, and $f_H$, MPIJSW A (reflects signal at $f_A$), C (reflects signal at $f_C$), E (reflects signal at $f_E$), G (reflects signal at $f_G$) are closed, and MPIJSW B (reflects signal at $f_B$), D (reflects $vf_D$), F (reflects signal at $f_F$), and H (reflects signal at $f_H$) are open, then the output signal (at the other port of the cascade) will contain only signals of $f_A$, $f_C$, $f_E$, and $f_G$ and signals of $f_B$, $f_D$, $f_F$, and $f_H$ will be reflected.

The effective bandwidth over which cascade 600 can selectively reflect (and therefore selectively transmit) signals of certain frequencies is therefore, $$BW = \{[f_1-BW_1/2 \text{ to } f_1+BW_1/2], [f_2-BW_2/2 \text{ to } f_2+BW_2/2], \ldots [f_N-BW_N/2 \text{ to } f_N+BW_N/2]\}$$

The reflecting or transmitting bandwidth BW of cascade 600 is greater than the reflecting or transmitting bandwidth of any single MPIJSW in configuration 600. Thus, cascade 600 is operable with a frequency multiplexed signal that spans a broader bandwidth than the operating bandwidth of a single MPIJSW.

With reference to FIG. 7, this figure depicts a flowchart of an example process for propagation or switching the signals of some but not all frequencies in a frequency multiplexed microwave signal using cascading multi-path interferometric Josephson switches with nonoverlapping bandwidths in accordance with an illustrative embodiment. Process 700 can be implemented using cascade 600 for the operations described in FIG. 6.

Each Josephson device in a set of Josephson devices is configured as an MPIJSW (block 702). The MPIJSW devices are connected in a cascade by connecting one MPIJSW with another MPIJSW in a series connection (block 704). The MPIJSW devices in the series connection are configured such that at least some MPIJSW devices (open MPIJSW devices) in the series reflect a microwave signal of their respective frequency back to the input port of the cascade. The cascade is built by adding all MPIJSW devices from the set in series in this manner (block 706).

The cascade operates to selectively reflect (as in FIG. 6) a frequency multiplexed input microwave signal where the signal contains a frequency corresponding to any of the open MPIJSW devices in the series (block 708).

The circuit elements of the MPIJSW device and connections thereto can be made of superconducting material. The respective resonators and transmission/feed/pump lines can be made of superconducting materials. The hybrid couplers can be made of superconducting materials. Examples of superconducting materials (at low temperatures, such as about 10-100 millikelvin (mK), or about 4 K) include Niobium, Aluminum, Tantalum, etc. For example, the Josephson junctions are made of superconducting material, and their tunnel junctions can be made of a thin tunnel barrier, such as an aluminum oxide. The capacitors can be made of superconducting material separated by low-loss dielectric material. The transmission lines (i.e., wires) connecting the various elements can be made of a superconducting material.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A cascading selective microwave switch (cascade) comprising:
   a set of Josephson devices, each Josephson device in the set having a corresponding operating bandwidth of microwave frequencies; and
   a series coupling between a first Josephson device from the set and an $n^{th}$ Josephson device from the set, wherein the series coupling causes the first Josephson device in an open state to reflect from the first Josephson device a signal of a first frequency from a frequency multiplexed microwave signal (multiplexed signal) and the $n^{th}$ Josephson device in a closed state to transmit a signal of an $n^{th}$ frequency in the multiplexed signal to an output port of the $n^{th}$ Josephson device.

2. The cascade of claim 1, further comprising:
   an $(n-1)^{th}$ Josephson device from the set in the series coupling, wherein n is greater than 1, wherein the $(n-1)^{th}$ Josephson device is included in the series coupling between the first Josephson device and the $n^{th}$ Josephson device, and wherein the $(n-1)^{th}$ Josephson device in the open state reflects back to an input port of the $(n-1)^{th}$ Josephson device a signal of an $(n-1)^{th}$ frequency from the multiplexed signal.

3. The cascade of claim 1, further comprising:
   an $(n-1)^{th}$ Josephson device from the set in the series coupling, wherein n is greater than 1, wherein the $(n-1)^{th}$ Josephson device is included in the series coupling between the first Josephson device and the $n^{th}$ Josephson device, and wherein the $(n-1)^{th}$ Josephson device in the closed state transmits a signal of an $(n-1)^{th}$ frequency in the multiplexed signal from an input port of the $(n-1)^{th}$ Josephson device to an output port of the $(n-1)^{th}$ Josephson device.

4. The cascade of claim 1,
   wherein the series coupling causes the first Josephson device in the open state to transmit the signal of the $n^{th}$ frequency from the multiplexed signal through the series coupling and the $n^{th}$ Josephson device in the open state to transmit the first frequency through the series.

5. The cascade of claim 1,
   wherein the series coupling causes the first Josephson device when open to transmit, from the multiplexed signal, signals of all frequencies that are incoming into the first Josephson except the signal of the first frequency through the series coupling, and
   wherein the series coupling causes the $n^{th}$ Josephson device when open to transmit, from the multiplexed signal, signals of all frequencies that are incoming into the $n^{th}$ Josephson except the signal of the $n^{th}$ frequency through the series coupling.

6. The cascade of claim 1,
wherein a first operating bandwidth of microwave frequencies corresponding to the first Josephson device is nonoverlapping for at least some frequencies with an $n^{th}$ operating bandwidth of microwave frequencies corresponding to the $n^{th}$ Josephson device.

7. The cascade of claim 6,
wherein a total switching bandwidth of the cascade comprises the first operating bandwidth and the $n^{th}$ operating bandwidth.

8. The cascade of claim 1, wherein the first Josephson device in the set of Josephson devices is an MPIJSW, comprises:
a first nondegenerate microwave mixer device (first mixer);
a second nondegenerate microwave mixer device (second mixer);
a first input/output (I/O) port coupled to an input port of the first mixer and an input port of the second mixer; and
a second I/O port coupled to the input port of the first mixer and the input port of the second mixer, wherein the signal of a first frequency communicated between the first I/O port and the second I/O port is transmitted while propagating in either direction between the first I/O port to the second I/O port through the first mixer when the MPIJSW is closed, and wherein the first frequency is in a first operating bandwidth of the first Josephson device.

9. The cascade of claim 8, further comprising:
a first microwave pump injecting a first microwave drive into the first mixer at a pump frequency and a first pump phase, wherein the first microwave pump is configured to cause the first mixer to operate at a frequency conversion working point; and
a second microwave pump injecting a second microwave drive into the second mixer at the pump frequency and a second pump phase wherein the second microwave pump is configured to cause the second mixer to operate at the frequency conversion working point.

10. The cascade of claim 8, wherein the first mixer and the second mixer are each a nondegenerate three-wave mixer.

11. The cascade of claim 8, wherein the first mixer and the second mixer are each a Josephson parametric converter (JPC), and wherein the first mixer and the second mixer are nominally identical.

12. A method to form a cascading selective microwave switch (cascade), the method comprising:
fabricating a set of Josephson devices, each Josephson device in the set having a corresponding operating bandwidth of microwave frequencies; and
forming a series coupling between a first Josephson device from the set and an $n^{th}$ Josephson device from the set, wherein the series coupling causes the first Josephson device in an open state to reflect back to an input port of the first Josephson device a signal of a first frequency from a frequency multiplexed microwave signal (multiplexed signal) and the $n^{th}$ Josephson device in a closed state to transmit a signal of an $n^{th}$ frequency in the multiplexed signal from an input port of the $n^{th}$ Josephson device to an output port of the $n^{th}$ Josephson device.

13. A superconductor fabrication system which when operated to fabricate a cascading selective microwave switch (cascade) performing operations comprising:
fabricating a set of Josephson devices, each Josephson device in the set having a corresponding operating bandwidth of microwave frequencies, wherein different operating bandwidths have different corresponding center frequencies; and
forming a series coupling between a first Josephson device from the set and an $n^{th}$ Josephson device from the set, wherein the series coupling causes the first Josephson device in an open state to reflect back to an input port of the first Josephson device a signal of a first frequency from a frequency multiplexed microwave signal (multiplexed signal) and the $n^{th}$ Josephson device in a closed state to transmit a signal of an $n^{th}$ frequency in the multiplexed signal from an input port of the $n^{th}$ Josephson device to an output port of the $n^{th}$ Josephson device.

14. The superconductor fabrication system of claim 13, further comprising:
an $(n-1)^{th}$ Josephson device from the set in the series coupling, wherein n is greater than 1, wherein the $(n-1)^{th}$ Josephson device is included in the series coupling between the first Josephson device and the $n^{th}$ Josephson device, and wherein the $(n-1)^{th}$ Josephson device in the open state reflects back to an input port of the $(n-1)^{th}$ Josephson device a signal of an $(n-1)^{th}$ frequency from the multiplexed signal.

15. The superconductor fabrication system of claim 13, further comprising:
an $(n-1)^{th}$ Josephson device from the set in the series coupling, wherein n is greater than 1, wherein the $(n-1)^{th}$ Josephson device is included in the series coupling between the first Josephson device and the $n^{th}$ Josephson device, and wherein the $(n-1)^{th}$ Josephson device in the closed state transmits a signal of an $(n-1)^{th}$ frequency in the multiplexed signal from an input port of the $(n-1)^{th}$ Josephson device to an output port of the $(n-1)^{th}$ Josephson device.

16. The superconductor fabrication system of claim 13, wherein the series coupling causes the first Josephson device in the open state to transmit the signal of the $n^{th}$ frequency from the multiplexed signal through the series coupling and the $n^{th}$ Josephson device in the open state to transmit the first frequency through the series.

17. The superconductor fabrication system of claim 13, wherein the series coupling causes the first Josephson device when open to transmit, from the multiplexed signal, signals of all frequencies that are incoming into the first Josephson except the signal of the first frequency through the series coupling, and
wherein the series coupling causes the $n^{th}$ Josephson device when open to transmit, from the multiplexed signal, signals of all frequencies that are incoming into the $n^{th}$ Josephson except the signal of the $n^{th}$ frequency through the series coupling.

18. The superconductor fabrication system of claim 13, wherein a first operating bandwidth of microwave frequencies corresponding to the first Josephson device is nonoverlapping for at least some frequencies with an $n^{th}$ operating bandwidth of microwave frequencies corresponding to the $n^{th}$ Josephson device.

19. The superconductor fabrication system of claim 18, wherein a total switching bandwidth of the cascade comprises the first operating bandwidth and the $n^{th}$ operating bandwidth.

20. The superconductor fabrication system of claim 13, wherein the first Josephson device in the set of Josephson devices is an MPIJSW, comprises:

a first nondegenerate microwave mixer device (first mixer);

a second nondegenerate microwave mixer device (second mixer);

a first input/output (I/O) port coupled to an input port of the first mixer and an input port of the second mixer; and a second I/O port coupled to the input port of the first mixer and the input port of the second mixer, wherein the signal of a first frequency communicated between the first I/O port and the second I/O port is transmitted while propagating in either direction between the first I/O port to the second I/O port through the first mixer when the MPIJSW is closed, and wherein the first frequency is in a first operating bandwidth of the first Josephson device.

* * * * *